United States Patent
Bowles et al.

(10) Patent No.: US 11,606,094 B2
(45) Date of Patent: Mar. 14, 2023

(54) DUAL-EDGE AWARE CLOCK DIVIDER

(71) Applicant: QUALCOMM Incorporated, San Diego, CA (US)

(72) Inventors: Kevin Bowles, Mission Viejo, CA (US); Vijay Kiran Kalyanam, Austin, TX (US); Sindhuja Sundararajan, Cedar Park, TX (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/468,945

(22) Filed: Sep. 8, 2021

(65) Prior Publication Data

US 2021/0409025 A1    Dec. 30, 2021

Related U.S. Application Data

(62) Division of application No. 16/883,467, filed on May 26, 2020, now Pat. No. 11,152,943.

(51) Int. Cl.
*H03K 21/02* (2006.01)
*H03K 23/40* (2006.01)
*H04B 1/40* (2015.01)

(52) U.S. Cl.
CPC ............ *H03K 21/026* (2013.01); *H03K 23/40* (2013.01); *H04B 1/40* (2013.01)

(58) Field of Classification Search
CPC .... H03K 21/026; H03K 23/40; H03K 23/486; H04B 1/40
See application file for complete search history.

(56) References Cited

U.S. PATENT DOCUMENTS

| | | | |
|---|---|---|---|
| 6,348,825 B1 | 2/2002 | Galbi et al. | |
| 9,705,522 B1* | 7/2017 | Ng | H03M 1/662 |
| 11,152,943 B1 | 10/2021 | Bowles | |
| 2005/0156638 A1* | 7/2005 | Ding | H03K 23/40 |
| | | | 327/115 |
| 2017/0288681 A1 | 10/2017 | Appleton | |
| 2017/0373825 A1* | 12/2017 | Wu | H03L 7/085 |
| 2019/0386643 A1 | 12/2019 | Sayago et al. | |

* cited by examiner

*Primary Examiner* — David S Huang

(57) ABSTRACT

A dual-edge aware clock divider configured to generate an output clock based on the input clock and a ratio of an integer M over an integer N is disclosed herein. The frequency of the output clock is based on a frequency of the input clock multiplied by the ratio (M/N), wherein M may be set to a range up to N. The output clock includes M pulses within a sequence time window having a length of N periods of the input clock. The output clock includes one or more rising edges that are substantially time aligned with one or more rising edges and one or more falling edges of the input clock, respectively. The dual-edge aware clock divider is configured to generate the output clock based on inverted and non-inverted portions of the input clock. A hybrid clock divider including the dual-edge and single-edge aware techniques is provided.

10 Claims, 9 Drawing Sheets

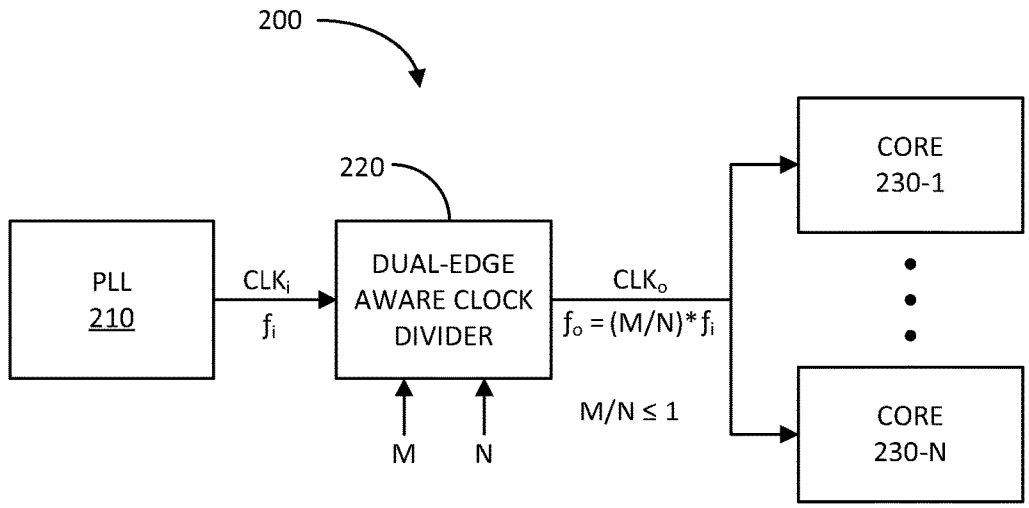
FIG. 2A
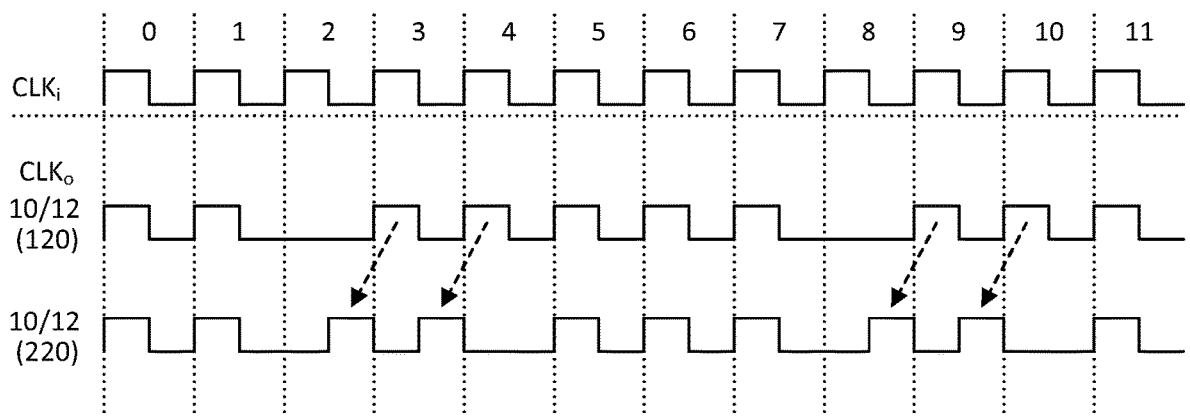
FIG. 2B
| IDEAL | M/N | 0 | 1 | 2 | 3 | 4 | 5 | 6 | 7 | 8 | 9 | 10 | 11 |
|---|---|---|---|---|---|---|---|---|---|---|---|---|---|
| | 100% | 0.0 | 1.0 | 2.0 | 3.0 | 4.0 | 5.0 | 6.0 | 7.0 | 8.0 | 9.0 | 10.0 | 11.0 |
| | 83.3% | 0.0 | 1.2 | 2.4 | 3.6 | 4.8 | 6.0 | 7.2 | 8.4 | 9.6 | 10.8 | | |
| | 66.7% | 0.0 | 1.5 | 3.0 | 4.5 | 6.0 | 7.5 | 9.0 | 10.5 | | | | |
| DUEL EDGE 220 | M/N | 0 | 1 | 2 | 3 | 4 | 5 | 6 | 7 | 8 | 9 | 10 | 11 |
|---|---|---|---|---|---|---|---|---|---|---|---|---|---|
| | 100% | 0.0 | 1.0 | 2.0 | 3.0 | 4.0 | 5.0 | 6.0 | 7.0 | 8.0 | 9.0 | 10.0 | 11.0 |
| | 83.3% | 0.0 | 1.0 | 2.5 | 3.5 | 5.0 | 6.0 | 7.0 | 8.5 | 9.5 | 11.0 | | |
| | 66.7% | 0.0 | 1.5 | 3.0 | 4.5 | 6.0 | 7.5 | 9.0 | 10.5 | | | | |
FIG. 2C

| $f_o$ | ACD-00 | ACD-01 | ACD-10 | ACD-11 |
|---|---|---|---|---|
| 100 | 66 | 66 | 50 | 33 |
| 91.7 | 66 | 66 | 50 | 33 |
| 83.3 | 66 | 66 | 50 | 33 |
| 75.0 | 66 | 66 | 50 | 33 |
| 66.7 | N/A | N/A | 50 | 33 |
| 62.5 | N/A | N/A | 50 | 33 |
| 58.3 | N/A | N/A | 50 | 33 |
| 54.2 | N/A | N/A | 50 | 33 |
| 50.0 | N/A | N/A | N/A | 33 |
| 45.8 | N/A | N/A | N/A | 33 |
| 41.7 | N/A | N/A | N/A | 33 |
| 37.5 | N/A | N/A | N/A | 33 |
| 33.3 | N/A | N/A | N/A | N/A |
| 29.2 | N/A | N/A | N/A | N/A |
| 25.0 | N/A | N/A | N/A | N/A |
| 20.8 | N/A | N/A | N/A | N/A |

| $f_o$ | ACD-00 | ACD-01 | ACD-10 | ACD-11 |
|---|---|---|---|---|
| 100 | 66 | 66 | 50 | 40 |
| 91.7 | 66 | 66 | 40 | 40 |
| 83.3 | 66 | 50 | 40 | 33 |
| 75.0 | 66 | 50 | 33 | 33 |
| 66.7 | 50 | 40 | 33 | 25 |
| 62.5 | 50 | 40 | 33 | 25 |
| 58.3 | 50 | 40 | 25 | 25 |
| 54.2 | 50 | 40 | 25 | 25 |
| 50.0 | 40 | 33 | 25 | 17 |
| 45.8 | 40 | 33 | 25 | 17 |
| 41.7 | 33 | 25 | 17 | 17 |
| 37.5 | 33 | 25 | 17 | 17 |
| 33.3 | 25 | 25 | 17 | 17 |
| 29.2 | 25 | 25 | 17 | 17 |
| 25.0 | 17 | 17 | 17 | 17 |
| 20.8 | 17 | 17 | 17 | 17 |

# DUAL-EDGE AWARE CLOCK DIVIDER

CROSS-REFERENCE TO RELATED APPLICATION

This application is a divisional of U.S. Non-Provisional application Ser. No. 16/883,467, filed on May 26, 2020, which is incorporated herein by reference.

FIELD

Aspects of the present disclosure relate generally to clock dividers, and in particular, to a dual-edge aware clock divider.

DESCRIPTION OF RELATED ART

A system-on-chip (SOC) integrated circuit (IC) typically includes a set of cores configured to perform different operations. For example, the set of cores may include a central processing unit (CPU) core, a graphics processing unit (GPU) core, a digital signal processing (DSP) core, a modulate/demodulate (MODEM) core, and others.

The SOC may also include a clock generator configured to generate a clock to drive the operations performed by the set of cores. The frequency of the clock typically controls how fast the cores perform the operations. The frequency is also proportional to the amount of power or current drawn by the cores, and may need to be reduced if the power or current consumption is too high and/or to prevent large voltage droops or instantaneous change in the current provided to the cores.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus. The apparatus includes a clock generator; a storage device to store a look up table (LUT) coupled to the clock generator; a logic circuit including an input coupled to the storage device; and a dual-edge clock multiplexer (DECM) including a set of inputs coupled to a set of outputs of the logic circuit, respectively, a select input coupled to the clock generator, and an output coupled to a set of one or more cores.

An aspect of the disclosure relates to an apparatus. The apparatus includes a phase locked loop (PLL) configured to generate an input clock; a dual-edge aware clock divider configured to generate an output clock based on the input clock and a ratio of an integer M over an integer N; and a set of one or more cores configured to perform one or more operations in response to the output clock.

Another aspect of the disclosure relates to a method. The method includes generating an input clock; generating an output clock in response to rising and falling edges of the input clock; and providing the output clock to a set of one or more cores.

Another aspect of the disclosure relates to a wireless communication device. The wireless communication device includes a set of one or more cores to process a baseband signal, and a clock divider to generate a clock for the set of one or more cores. The clock divider includes a clock generator, a storage device to store a look up table (LUT) coupled to the clock generator, a logic circuit including an input coupled to the storage device, and a dual-edge clock multiplexer (DECM) including a set of inputs coupled to a set of outputs of the logic circuit, respectively, a select input coupled to the clock generator, and an output to generate the clock for the set of one or more cores. The wireless communication device further includes a management circuit coupled to the clock divider to control a frequency of the clock, a radio frequency (RF) section to generate a transmit RF signal based on the baseband signal or to generate the baseband signal based on a received RF signal, and at least one antenna to wirelessly transmit the transmit RF signal or wirelessly receive the received RF signal.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

BRIEF DESCRIPTION OF THE DRAWINGS

FIG. 2A illustrates a block diagram of another exemplary clock distribution system in accordance with aspect of the disclosure.

FIG. 2B illustrates a timing diagram comparing an exemplary operation of the single-edge aware clock divider of FIG. 1A with a dual-edge aware clock divider of FIG. 2A in accordance with another aspect of the disclosure.

FIG. 2C illustrates a pair of tables depicting where rising edges of ideal and actual output clocks occur in time with respect to the rising edges of an input clock in accordance with another aspect of the disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1A:
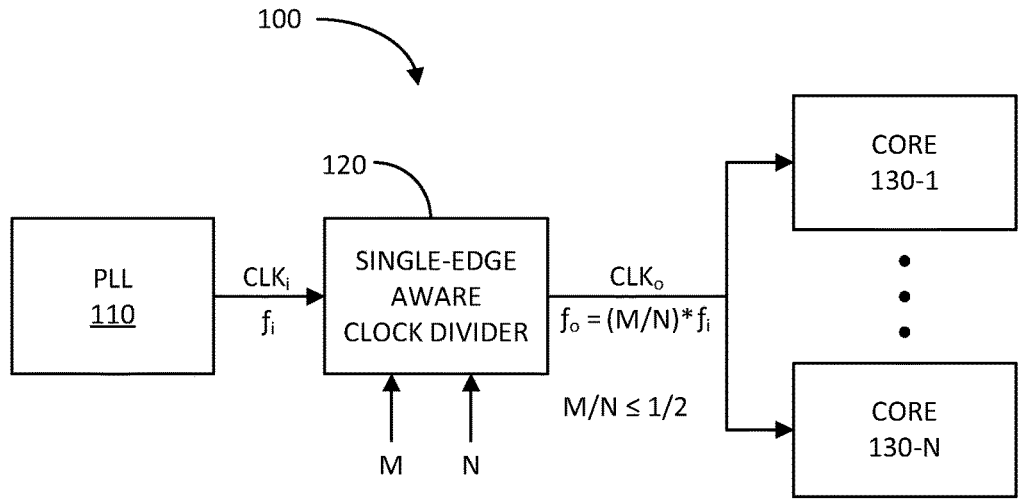
FIG. 1A illustrates a block diagram of an exemplary clock distribution system in accordance with an aspect of the disclosure.

FIG. 1A illustrates a block diagram of an exemplary clock distribution system 100 in accordance with an aspect of the disclosure. The clock distribution system 100 includes a phase lock loop (PLL) 110, a single-edge aware clock divider 120, and a set of one or more cores 130-1 to 130-N. The PLL 110 is configured to generate an input clock $CLK_i$ cycling at a particular frequency $f_i$. The single-edge aware clock divider 120 is configured to generate an output clock $CLK_o$ by frequency scaling the input clock $CLK_i$ based on a ratio of integer M over integer N (M/N). Accordingly, the output clock $CLK_o$ cycles with a frequency $f_o$ being the frequency scaling ratio M/N multiplied by the frequency $f_i$ of the input clock $CLK_i$ (e.g., $f_o=(M/N)*f_i$). The output clock $CLK_o$ may be provided to the set of one or more cores 130-1 to 130-N (e.g., central processing unit (CPU) core, graphics processing unit (GPU) core, digital signal processing unit (DSP) core, etc.).

Figure 1B:
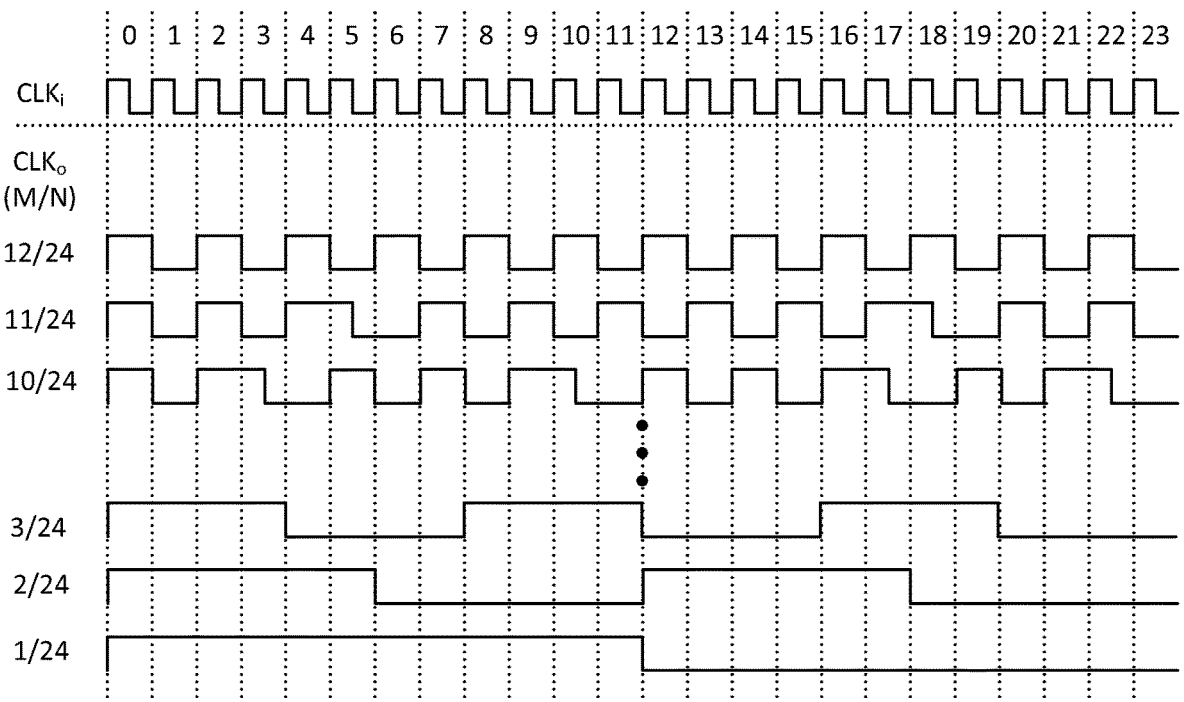
FIG. 1B illustrates a timing diagram of an exemplary operation of a single-edge aware clock divider of the clock distribution system of FIG. 1A in accordance with another aspect of the disclosure.

FIG. 1B illustrates a timing diagram of an exemplary operation of the single-edge aware clock divider 120 of the clock distribution system 100 in accordance with another aspect of the disclosure. The timing diagram includes a vertical axis representing various clocks. For example, from top-to-bottom, the represented clocks are the input clock $CLK_i$, the output clock $CLK_o$ for the case where the frequency scaling ratio M/N is 12/24, the output clock $CLK_o$ for the case where the frequency scaling ratio M/N is 11/24, the output clock $CLK_o$ for the case where the frequency scaling ratio M/N is 10/24, and so on to, the output clock $CLK_o$ for the case where the frequency scaling ratio M/N is 3/24, the output clock $CLK_o$ for the case where the frequency scaling ratio M/N is 2/24, and the output clock $CLK_o$ for the case where the frequency scaling ratio M/N is 1/24.

The timing diagram includes a horizontal axis representing time. The time axis is divided by periods of the input clock $CLK_i$. For example, the timing diagram shows 24 periods of the input clock $CLK_i$ labeled 0-23. The number of periods shown represents a sequence time window, in which all sequences of the output clock $CLK_o$ may be completed to generate the required frequency $f_o$. Beyond period 23, the sequences of the output clock $CLK_o$ repeats for the next 24 periods, and so on. The sequence time window has a length equal to the integer N periods of the input clock $CLK_i$, where N is the denominator of the frequency scaling ratio M/N previously mentioned. In this example, N is 24. The integer N is also indicative of the frequency resolution (1/N) of the output clock $CLK_o$. In this example, the frequency resolution of the output clock $CLK_o$ is 1/24.

The single-edge aware clock divider 120 frequency scales the input clock $CLK_i$ to generate the output clock $CLK_o$ using a pulse swallowing technique. For example, with regard to the output clock $CLK_o$ for the case where M/N is 12/24, the single-edge aware clock divider 120 swallows every other pulse of the input clock $CLK_i$ to generate the output clock $CLK_o$. For instance, in this example, the single-edge aware clock divider 120 has swallowed all the odd pulses (1, 3, 5, etc.) of the input clock $CLK_i$ to generate the output clock $CLK_o$. Accordingly, the output clock $CLK_o$ in the case of M/N being 12/24 has 12 pulses within the sequence time window. Thus, the output clock $CLK_o$ has M pulses within the sequence time window with a length of integer N periods of the input clock $CLK_i$.

Note, that using the pulse swallowing technique results in the rising edges of the output clock $CLK_o$ substantially aligning in time with the rising edges of the input clock $CLK_i$. Accordingly, the single-edge aware clock divider 120 is referred to being single-edge aware because the rising edge of the input clock $CLK_i$ triggers a new pulse swallowing event. As discussed with reference to the case M/N=12/24, every other rising edge of the input clock $CLK_i$ triggers a new pulse swallowing event.

In the case of M/N equal to 11/24, the output clock $CLK_o$ has 11 pulses within the sequence time window. In this case, the single-edge aware clock divider 120 swallows every other pulse of input clock $CLK_i$ during each of periods 0-3, 7-16, and 20-23, and swallows two pulses of the input clock $CLK_i$ during each of periods 4-6 and 17-19. This results in the output clock $CLK_o$ having 11 pulses within the sequence time window. Again, the rising edges of the output $CLK_o$ substantially align in time with the rising edges of the input clock $CLK_i$.

In the case of M/N equal to 10/24, the output clock $CLK_o$ has 10 pulses within the sequence time window. In this case, the single-edge aware clock divider 120 swallows every other pulse of input clock $CLK_i$ during each of periods 0-1, 5-8, 12-15, and 19-20, and swallows two pulses of the input clock $CLK_i$ during each of periods 2-4, 9-11, 16-18, and 21-23. This results in the output clock $CLK_o$ having 10 pulses within the sequence time window. Again, the rising edges of the output $CLK_o$ substantially align in time with the rising edges of the input clock $CLK_i$.

The single-edge aware clock divider 120 employs this pulse swallowing technique to generate the output clock $CLK_o$ for the remaining M/N=9/24 to 1/24. For additional examples, the output clock $CLK_o$ for the case of M/N=3/24, 2/24, and 1/24 are illustrated. In the case of M/N being 3/24, the single-edge aware clock divider 120 swallows seven (7) pulses of input clock $CLK_i$ during each of periods 0-7, 8-15, and 16-23 to generate the output clock $CLK_o$ with three (3) pulses within the sequence time window. In the case of M/N being 2/24, the single-edge aware clock divider 120 swallows 11 pulses of input clock $CLK_i$ during each of periods 0-11 and 12-23 to generate the output clock $CLK_o$ with two (2) pulses within the sequence time window. And, in the case of M/N being 1/24, the single-edge aware clock divider 120 swallows 23 pulses of input clock $CLK_i$ during periods 0-23 to generate the output clock $CLK_o$ with one (1) within the sequence time window. Again, for each of the cases, the rising edges of the output $CLK_o$ substantially align in time with the rising edges of the input clock $CLK_i$.

A drawback of the single-edge aware clock divider 120 is that the frequency scaling ratio M/N is limited to a maximum of 2/3. Above 2/3, the single-edge aware clock divider 120 has issues performing the clock dividing operation. This results in the maximum frequency $f_o$ of the output clock $CLK_o$ applied to the set of one or more cores 130-1 to 130-N being limited. For example, if the PLL 110 is limited to a maximum frequency $f_i$ of two (2) giga Hertz (GHz), then the frequency $f_o$ of the output clock $CLK_o$ is limited to a maximum frequency of 1.33 GHz. And, often, the frequency scaling ratio M/N of the single-edge aware clock divider 120 is further limited to ½ (e.g., 12/24 in example discussed), which results in the frequency $f_o$ of the output clock $CLK_o$ being limited to a maximum frequency of 1.0 GHz. Accordingly, there may be some cores that are capable of operating operate at frequencies higher than, for example, 1.0 GHz. In such cases, the single-edge aware clock divider 120 may not be suitable for providing a clock with the desired frequency for such cores.

FIG. 2A illustrates a block diagram of another exemplary clock distribution system 200 in accordance with another aspect of the disclosure. The clock distribution system 200 includes a PLL 210, a dual-edge aware clock divider 220, and a set of one or more cores 230-1 to 230-N. The PLL 210 is configured to generate an input clock $CLK_i$ cycling at a particular frequency $f_i$. The dual-edge aware clock divider 220 is configured to generate an output clock $CLK_o$ by frequency scaling the input clock $CLK_i$ by a ratio of an integer M over an integer N (M/N). Accordingly, the output clock $CLK_o$ cycles with a frequency $f_o$ being the scaling ratio M/N multiplied by the frequency $f_i$ of the input clock $CLK_i$ (e.g., $f_o=(M/N)*f_i$). The output clock $CLK_o$ may be provided to the set of one or more cores 230-1 to 230-N (e.g., central processing unit (CPU) core, graphics processing unit (GPU) core, digital signal processing unit (DSP) core, etc.).

As the name indicates, the dual-edge aware clock divider 220 responds to both rising edges and falling edges of the input clock $CLK_i$ to generate the output clock $CLK_o$. In such case, the dual-edge aware clock divider 220 is no longer limited to a scaling factor M/N of 2/3, as in the case of single-edge aware clock divider 120. Thus, the frequency $f_o$ of the output clock $CLK_o$ may be as high as the frequency $f_i$ of the input clock $CLK_i$, such as in the case where M/N is equal to one (1). Considering the same example described above with reference to clock distribution system 100, if the PLL 210 is limited to generating an input clock $CLK_i$ with a maximum frequency $f_i$ of 2 GHz, then the dual-edge aware clock divider 220 is able to generate an output clock $CLK_o$ with a maximum frequency $f_o$ of 2 GHz. This allows cores that are able to operate at such frequency to use the dual-edge aware clock divider 220 to provide them the clock with the needed frequency.

FIG. 2B illustrates a timing diagram comparing an exemplary operation of the single-edge aware clock divider 120 with the dual-edge aware clock divider 220 in accordance with another aspect of the disclosure. Similar to timing diagram of FIG. 1B, the vertical axis, from top-to-bottom, represents the input clock $CLK_i$, the output clock $CLK_o$ generated by the single-edge aware clock divider 120 for the case where the frequency scaling factor M/N is 10/12, and the output clock $CLK_o$ generated by the dual-edge aware clock divider 220 also for the case where the frequency scaling factor M/N is 10/12.

The horizontal axis represents time. The time axis is divided by periods of the input clock $CLK_i$. For example, the timing diagram shows 12 periods of the input clock $CLK_i$ labeled 0-11. Thus, in this example, the sequence time window has a length of 12 (e.g., N=12), and the frequency resolution is 1/12. As previously discussed, the integer M represents the number of pulses of the output clock $CLK_o$ within the sequence time window. Thus, for the case of frequency scaling ratio 10/12, there are 10 pulses of the output clock $CLK_o$ within the sequence time window of length 12 periods of the input clock $CLK_i$.

As previously discussed, the single-edge aware clock divider 120 performs the frequency scaling by employing a pulse swallowing technique. In the case of M/N equal to 10/12, the single-edge aware clock divider 120 has to swallow two (2) pulses of the input clock $CLK_i$ during the sequence time window to generate the 10 pulses of the output clock $CLK_o$. Thus, the single-edge aware clock divider 120 outputs the pulses (does not swallow pulse) of the input clock $CLK_i$ during periods 0, 3-7, and 9-11, and swallows a pulse during each of periods 1-2 and 7-8. This results in the output clock $CLK_o$ having 10 pulses within the sequence time window. Again, the rising edges of the output $CLK_o$ align in time with the rising edges of the input clock $CLK_i$. In this example, the rising edges of the input clock $CLK_i$ during periods 1 and 7 trigger corresponding pulse swallowing events.

In contrast, the dual-edge aware clock divider 220 generates the output clock $CLK_o$ by selectively inverting or non-inverting the input clock $CLK_i$ on a period-to-period basis. The dual-edge aware clock divider 220 responds to both rising edges and falling edges to determine whether to output the non-inverted input clock $CLK_i$ or to output the inverted input clock $CLK_i$ to generate the output clock $CLK_o$. That is, the output clock $CLK_o$ is based on an inversion and non-inversion of the input clock $CLK_i$. For instance, in this example, the dual-edge aware clock divider 220 outputs the non-inverted input clock $CLK_i$ during periods 0, 1, 4.5-8, and 10.5-11, and outputs the inverted input clock $CLK_i$ during periods 2-4.5 and 7-10.5.

Note that, in this example, the trigger from inverting mode to non-inverting mode occurs at periods 4.5 and 10.5. Thus, in such case, the dual-edge aware clock divider 220 responds to the falling edges of the input clock $CLK_i$. Similarly, the trigger from non-inverting mode to inverting mode occurs at periods 2 and 8. Thus, in such case, the dual-edge aware clock divider 220 also responds to the rising edges of the input clock $CLK_i$.

Comparing the two output clocks $CLK_o$ generated by the single-edge aware clock divider 120 and the dual-edge aware clock divider 220, the pulses that occur in clock periods 3-4 and 9-10 in the output clock $CLK_o$ generated by the single-edge aware clock divider 120 has been shifted or redistributed (indicated by the arrows) to clock periods 2.5-3.5 and 8.5-9.5 in the output clock $CLK_o$ generated by the dual-edge aware clock divider 220, respectively. This may be referred to as a pulse redistribution process. As discussed further herein, the edges of the output clock $CLK_o$ generated by the dual-edge aware clock divider 220 are closer (with respect to the output clock $CLK_o$ generated by the single-edge aware clock divider 120) to the ideal case of the output clock $CLK_o$ being generated with substantially constant periods. This results in significantly less power distribution noise (PDN) associated with a voltage regulator providing power to a set of one or more cores driven by the output clock $CLK_o$.

FIG. 2C illustrates a pair of tables depicting where in time rising edges of ideal and actual output clocks occur with respect to rising edges of an input clock in accordance with another aspect of the disclosure. The upper table is related to the ideal case where the output clock $CLK_o$ has substantially constant periods. The lower table is related to the output clock $CLK_o$ generated by the dual-edge aware clock divider 220.

In each of the tables, the second column from the left indicates the frequency scaling factor M/N. Three examples are provided: (1) where the frequency $f_o$ of the output clock $CLK_o$ is at 100% of the frequency $f_i$ of the input clock $CLK_i$ (e.g., M/N=12/12); (2) where the frequency $f_o$ of the output clock $CLK_o$ is at 83.3% of the frequency $f_i$ of the input clock $CLK_i$ (e.g., M/N=10/12); and (3) where the frequency $f_o$ of the output clock $CLK_o$ is at 66.7% of the frequency $f_i$ of the input clock $CLK_i$ (e.g., M/N=8/12).

The top row of the tables represents the periods of the input clock $CLK_i$ ranging from 0 to 11 in the sequence time window. The second row represents the time instances in terms of the periods of the input clock $CLK_i$ where rising edges of the output clock $CLK_o$ occur for the case of M/N=100%. The third row represents the time instances in terms of the periods of the input clock $CLK_i$ where rising edges of the output clock $CLK_o$ occur for the case of M/N=83.8%. And the third row represents the time instances in terms of the periods of the input clock $CLK_i$ where rising edges of the output clock $CLK_o$ occur for the case of M/N=66.7%.

With regard to the ideal case, the rising edges of the output clock $CLK_o$ occur at 0.0, 1.0, 2.0, 3.0, 4.0, 5.0, 6.0, 7.0, 8.0, 9.0, 10.0, and 11.0 at M/N=100% (e.g., the rising edges of the output clock $CLK_o$ are substantially time aligned with the rising edges of the input clock $CLK_i$, respectively). For the case of M/N=83.3%, the rising edges of the ideal output clock $CLK_o$ occur at 0.0, 1.2, 2.4, 3.6, 4.8, 6.0, 7.2, 8.4, 9.6, and 10.8. For the case of M/N=66.7%, the rising edges of the ideal output clock $CLK_o$ occur at 0.0, 1.5, 3.0, 4.5, 6.0, 7.5, 9.0, and 10.5.

With regard to the output clock $CLK_o$ generated by the dual-edge aware clock divider 220, the rising edges of the output clock $CLK_o$ occur at 0.0, 1.0, 2.0, 3.0, 4.0, 5.0, 6.0, 7.0, 8.0, 9.0, 10.0, and 11.0 at M/N=100% (e.g., the rising edges of the output clock $CLK_o$ are substantially time aligned with the rising edges of the input clock $CLK_i$, respectively). For the case of M/N=83.3%, the rising edges of the ideal output clock $CLK_o$ occur at 0.0, 1.0, 2.5, 3.5, 5.0, 6.0, 7.0, 8.5, 9.5, and 11.0. For the case of M/N=66.7%, the rising edges of the ideal output clock $CLK_o$ occur at 0.0, 1.5, 3.0, 4.5, 6.0, 7.5, 9.0, and 10.5.

Because the dual-edge aware clock divider 220 responds to both rising and falling edges, it has a granularity of 0.5 clock periods in positioning the rising edges. Because the rising edges of the ideal output clock $CLK_o$ for M/N=100% and M/N=67.7% occur at either an integer or half-an-integer, the dual-edge aware clock divider 220 is able to generate the output clock $CLK_o$ substantially in accordance with the ideal output clock $CLK_o$.

With regard to the case of M/N=83.3%, the dual-edge aware clock divider 220 is able to generate the rising edges with no more than a 0.2 clock period error. For example, the second pulse of the ideal output clock $CLK_o$ occurs at 1.2 clock periods, whereas the second pulse of the dual-edge output clock occurs at 1.0 clock period. The error in the remaining eight (8) pulses are as follows: 0.1, 0.1, 0.2, 0, 0.2, 0.1, 0.1, and 0.2, respectively. Compared to the pulse swallow technique employed by the single-edge aware clock divider 120 that has a granularity of 1.0 clock periods, the error could be as high as 0.6 clock period. Again, as previously mentioned, the less departure from the ideal output clock $CLK_o$ results in significantly less PDN noise in the power supplied to the associated cores.

Figure 3A:
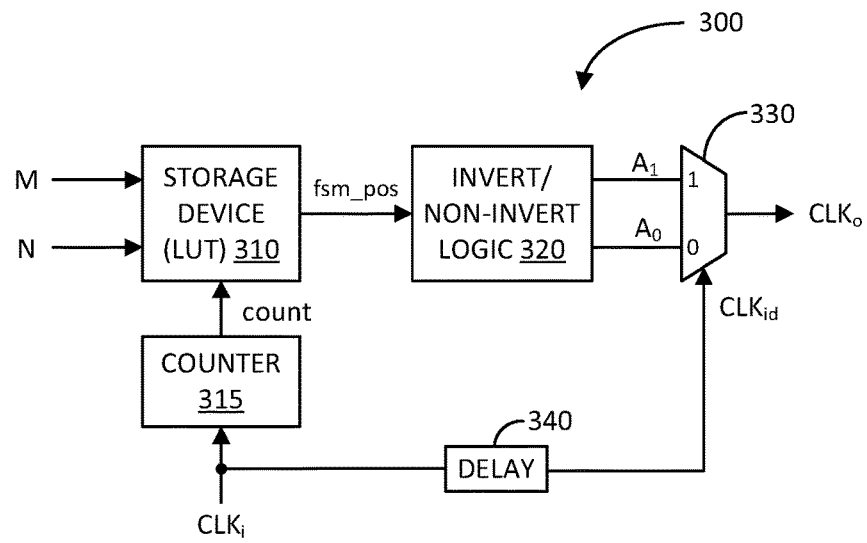
FIG. 3A illustrates a block diagram of another exemplary dual-edge aware clock divider in accordance with another aspect of the disclosure.

FIG. 3A illustrates a block diagram of another exemplary dual-edge aware clock divider 300 in accordance with aspect of the disclosure. The dual-edge aware clock divider 300 may be an exemplary more detailed implementation of the dual-edge aware clock divider 220 previously discussed. The dual-edge aware clock divider 300 includes a storage device to store a look-up table (LUT) 310, a counter 315, an invert/non-invert logic circuit 320, a dual-edge clock multiplexer ("mux") (DECM) 330, and a delay element 340.

The counter 315 is configured to generate a count in response to the input clock $CLK_i$. The count tracks the sequence time window in terms of edges of the input clock $CLK_i$. The LUT 310 is configured to receive the integers M and N pertaining to the frequency scaling factor, and retrieve values from a table in response to the count to generate a control signal fsm_pos based on M and N. The control signal fsm_pos controls whether the dual-edge aware clock divider 300 is to effectively output a non-inverted input clock $CLK_i$ or the inverted input clock $CLK_i$ to generate an output clock $CLK_o$, as previously discussed.

The invert/non-invert logic circuit 320 is configured generate a set of control signals $A_1$ and $A_0$ based on the control signal fsm_pos from the LUT 310. For example, if the control signal fsm_pos is at a high logic level, the invert/non-invert logic circuit 320 is configured to generate the signals $A_1$ and $A_0$ at high and low logic levels, respectively. If, on the other hand, the control signal fsm_pos is at a low logic level, the invert/non-invert logic circuit 320 is configured to generate the signals $A_1$ and $A_0$ at low and high logic levels, respectively.

The DECM 330 is configured to select either the signal $A_1$ at its input "1" or the signal $A_0$ at its input "0" in response to a rising or falling edge of a delayed input clock $CLK_{id}$ applied to its select input. The delay element 340 is configured to generate the delayed input clock $CLK_{id}$ by delaying the input clock $CLK_i$. The amount by which the delay element 340 delays the input clock $CLK_i$ is such that the signals $A_1$ and $A_0$ are present at the inputs of the DECM 330 one-half clock period prior to the period in which the signals $A_1$ and $A_0$ control the state of the output clock $CLK_o$. The operation of the dual-edge aware clock divider 300 is discussed as follows.

Figure 3B:
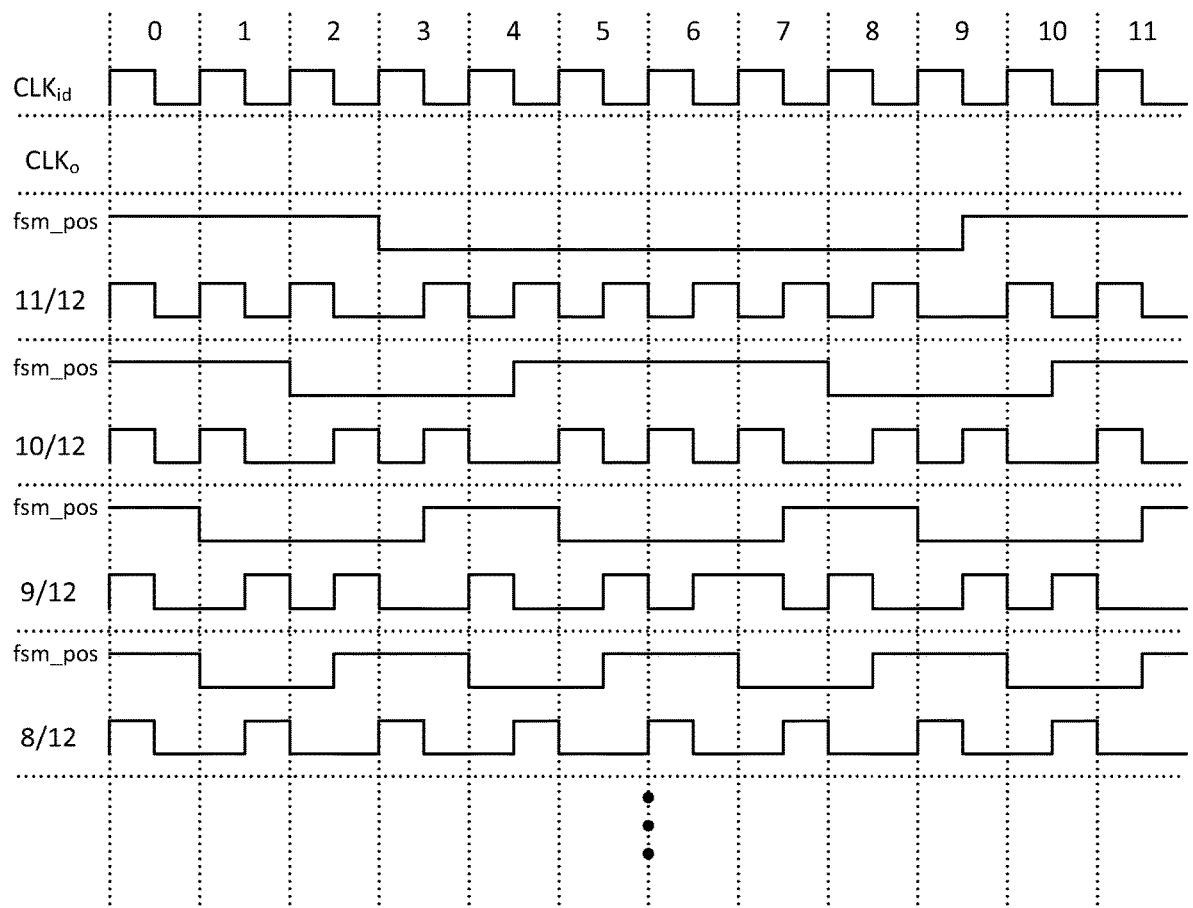
FIG. 3B illustrates a timing diagram of an exemplary operation of the dual-edge aware clock divider of FIG. 3A in accordance with another aspect of the disclosure.

FIG. 3B illustrates a timing diagram of an exemplary operation of the dual-edge aware clock divider 300 in accordance with another aspect of the disclosure. The vertical axis represents various signals including, from top to bottom, the delayed input clock $CLK_{id}$, the output clock $CLK_o$ and associated control signal fsm_pos for the case where M/N equals 11/12, the output clock $CLK_o$ and associated control signal fsm_pos for the case where M/N equals 10/12, the output clock $CLK_o$ and associated control signal fsm_pos for the case where M/N equals 9/12, and the output clock $CLK_o$ and associated control signal fsm_pos for the case where M/N equals 8/12. The illustrated M/N examples are but a few, and it shall be understood that the operation discussed with reference to these examples apply to the output clock $CLK_o$ and control signals fsm_pos for other M/N values.

The horizontal axis represents time. The time axis is divided by periods of the delayed input clock $CLK_{id}$. For example, the timing diagram shows 12 periods of the delayed input clock $CLK_{id}$ labeled 0-11. Thus, in this example, the sequence time window has a length of 12 (e.g., N=12), and the frequency resolution is 1/12. As previously discussed, the integer M represents the number of pulses of the output clock $CLK_o$ within the sequence time window.

The generating of the output clock CLKo for the case where M/N equals 11/12 will now be discussed. Although the control signal fsm_pos lags one half period or more of the delayed input clock $clk_{id}$ depending on the amount of delay provided by the delay element 340, the fsm_pos signal is illustrated to be synchronous with the delayed input clock $CLK_{id}$ for ease of explanation. At the beginning of the sequence time window as indicated by the count, the LUT 310 retrieves the appropriate value from the table based on the count, and sets and maintains the fsm_pos at a high logic level for the first three (3) periods of the delayed input clock $CLK_{id}$. In response, the invert/non-invert logic circuit 320 sets and maintains the signals $A_0$ and $A_1$ at high and low logic levels for the first three (3) periods of the delayed input clock $CLK_{id}$, respectively.

In response to the $A_0$ and $A_1$ at high and low logic levels, the DECM 330 outputs $A_1$ (high) in response to the rising edge in period "0" and outputs $A_0$ (low) in response to the falling edge in period "0"; outputs $A_1$ (high) in response to the rising edge in period "1" and outputs $A_0$ (low) in response to the falling edge in period "1"; and outputs $A_1$ (high) in response to the rising edge in period "2" and outputs $A_0$ (low) in response to the falling edge in period "2". Thus, during periods 0-2, the dual-edge aware clock divider 300 effectively outputs the non-inverted input clock $CLK_i$ to generate that portion of the output clock $CLK_o$.

At the beginning of period "3" of the sequence time window as indicated by the count, the LUT 310 retrieves the appropriate value from the table based on the count, and sets and maintains the fsm_pos at a low logic level for the next 6.5 periods of the delayed input clock $CLK_{id}$. In response, the invert/non-invert logic circuit 320 sets and maintains the signals $A_0$ and $A_1$ at low and high logic levels for the next 6.5 periods of the delayed input clock $CLK_{id}$, respectively.

In response to the $A_0$ and $A_1$ at low and high logic levels, the DECM 330 outputs $A_1$ (low) in response to the rising edge in period "3" and outputs $A_0$ (high) in response to the falling edge in period "3"; outputs $A_1$ (low) in response to the rising edge in period "4" and outputs $A_0$ (high) in response to the falling edge in period "4"; outputs $A_1$ (low) in response to the rising edge in period "5" and outputs $A_0$ (high) in response to the falling edge in period "5"; outputs $A_1$ (low) in response to the rising edge in period "6" and outputs $A_0$ (high) in response to the falling edge in period "6"; outputs $A_1$ (low) in response to the rising edge in period "7" and outputs $A_0$ (high) in response to the falling edge in period "7"; outputs $A_1$ (low) in response to the rising edge in period "8" and outputs $A_0$ (high) in response to the falling edge in period "8"; and outputs $A_1$ (low) in response to the rising edge in period "9". Thus, during periods 3-9.5, the dual-edge aware clock divider 300 effectively outputs the inverted input clock $CLK_i$ to generate that portion of the output clock $CLK_o$.

At period "9.5" of the sequence time window as indicated by the count, the LUT 310 retrieves the appropriate value from the table based on the count, and sets and maintains the fsm_pos at a high logic level for the remaining 2.5 periods of the sequence time window. In response, the invert/non-invert logic 320 sets and maintains the signals $A_0$ and $A_1$ at high and low logic levels for the remaining 2.5 periods of the sequence time window.

In response to the $A_0$ and $A_1$ at high and low logic levels, the DECM 330 outputs $A_0$ (low) in response to the falling edge in period "9"; outputs $A_1$ (high) in response to the rising edge in period "10" and outputs $A_0$ (low) in response to the falling edge in period "10"; and outputs $A_1$ (high) in response to the rising edge in period "11" and outputs $A_0$ (low) in response to the falling edge in period "11". Thus, during periods 9.5-11, the dual-edge aware clock divider 300 effectively outputs the non-inverted input clock $CLK_i$ to generate that portion of the output clock $CLK_o$. As previously discussed, the output clock generating operation during the sequence time window repeats if the output clock $CLK_o$ with a frequency $f_o$ of 11/12 the frequency $f_i$ of the input clock $CLK_i$ is to be maintained.

Similar to operation of the dual-edge aware clock divider 300 in generating the output clock $CLK_o$ with a frequency $f_o$ of 11/12 the frequency $f_i$ of the input clock $CLK_i$, the dual-edge aware clock divider 300 generates the output clock $CLK_o$ with frequencies dictated by different M/N values. The timing diagram illustrates the output clock $CLK_o$ and the corresponding control signals fsm_pos for values M/N of 10/12, 9/12, and 8/12. It shall be understood that the dual-edge aware clock divider 300 may be configured to generate the output clock $CLK_o$ with frequencies for values 7/12 to 1/12 (or other values) in a similar manner as discussed with reference to generating the output clock $CLK_o$ for M/N equal to 11/12 previously discussed in detail.

Figure 4:
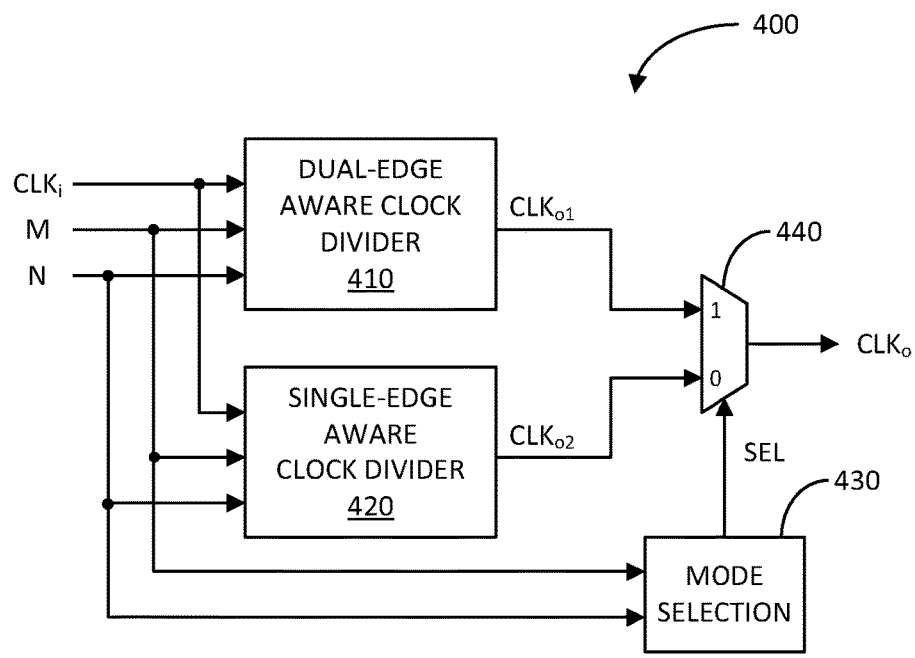
FIG. 4 illustrates a block diagram of an exemplary hybrid single-edge and dual-edge aware clock divider in accordance with another aspect of the disclosure.

FIG. 4 illustrates a block diagram of an exemplary hybrid single-edge and dual-edge aware clock divider 400 in accordance with another aspect of the disclosure. As previously discussed, the single-edge aware clock divider 120 may be restricted to a maximum frequency scaling factor M/N (e.g., 2/3) above which it may not reliability generate an output clock $CLK_o$ from an input clock $CLK_i$. However, the single-edge aware clock divider 120 may still be useful in generating an output clock $CLK_o$ for values of M/N at or below such limit or threshold. In this regard, the hybrid single-edge and dual-edge aware clock divider 400 includes a dual-edge aware clock divider configured to generate the output clock $CLK_o$ when M/N is at or above a threshold (e.g., for a range from the threshold up to M/N=1), and a single-edge aware clock divider configured to generate the output clock $CLK_o$ when M/N is at or below the threshold (e.g., for a range from M/N=1/N up to the threshold).

More specifically, the hybrid single-edge and dual-edge aware clock divider 400 includes a dual-edge aware clock divider 410, a single-edge aware clock divider 420, a mode selection circuit 430, and a multiplexer 440. The dual-edge aware clock divider 410 is configured to generate a first candidate output clock $CLK_{o1}$ based on an input clock $CLK_i$ and values of M and N, as previously discussed with reference to dual-edge aware clock dividers 220 and 300. The single-edge aware clock divider 420 is configured to generate a second candidate output clock $CLK_{o2}$ based on the input clock $CLK_i$ and the values of M and N, as previously discussed with reference to single-edge aware clock divider 120.

The multiplexer 440 is configured to receive the first and second candidate output clocks $CLK_{o1}$ and $CLK_{o2}$ at its inputs "1" and "0", respectively. The mode selection circuit 430 is configured to receive the M and N values. The mode selection circuit 430 is further configured to generate a select (SEL) signal based on the M and N values. For example, the mode selection circuit 430 is configured to generate the select (SEL) signal to control the multiplexer 440 to output the first candidate output clock $CLK_{o1}$ as the output clock $CLK_o$ if the M and N values indicate that the frequency scaling factor M/N is at or above a threshold (e.g., 2/3). The mode selection circuit 430 is further configured to generate the select (SEL) signal to control the multiplexer 440 to output the second candidate output clock $CLK_{o2}$ as the output clock $CLK_o$ if the M and N values indicate that the frequency scaling factor M/N is at or below the threshold (e.g., 2/3).

Figure 5:
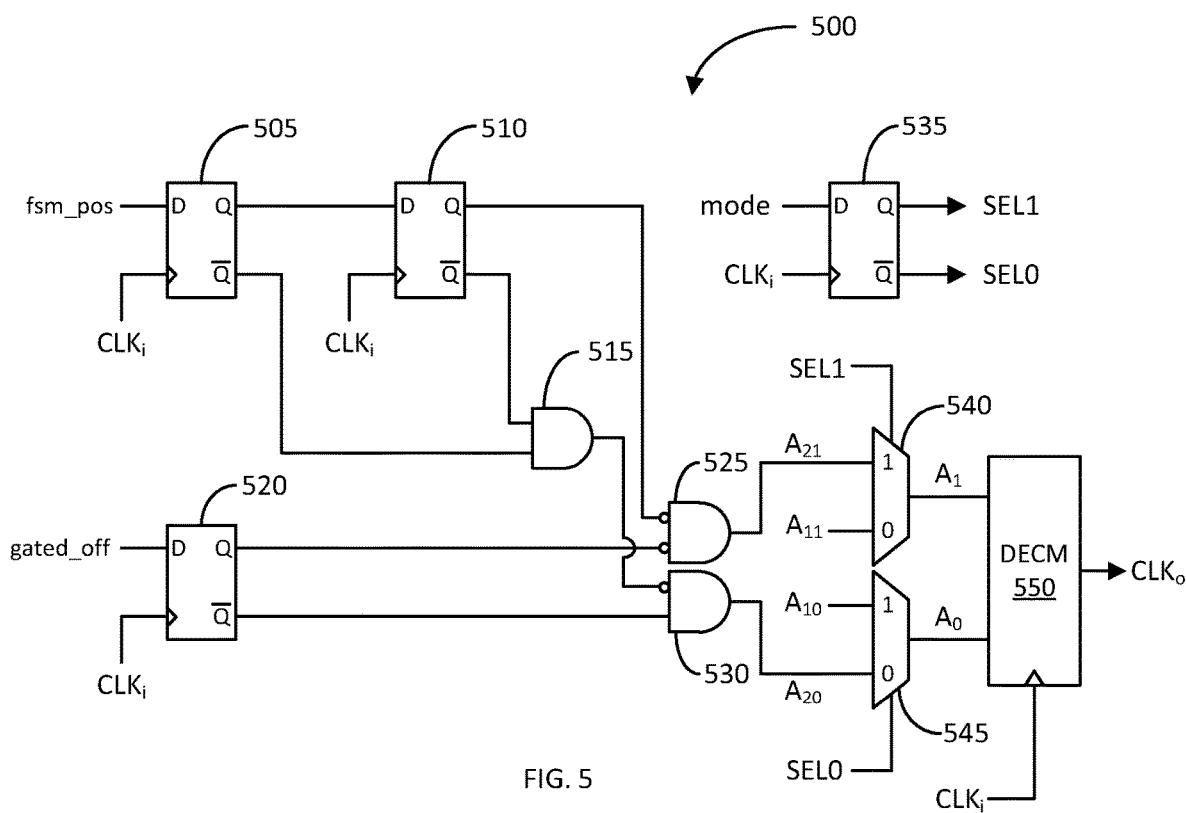
FIG. 5 illustrates a block diagram of another exemplary hybrid single-edge and dual-edge aware clock divider in accordance with another aspect of the disclosure.

FIG. 5 illustrates a block diagram of another exemplary hybrid single-edge and dual-edge aware clock divider 500 in accordance with another aspect of the disclosure. The hybrid single-edge and dual-edge aware clock divider 500 may be an exemplary more detailed implementation of the hybrid single-edge and dual-edge aware clock divider 400 previously discussed.

In particular, the hybrid single-edge and dual-edge aware clock divider 500 includes a first flip-flop 505, a second flip-flop 510, a third flip-flop 520, a fourth flip-flop 535, an AND gate 515, an AND gate 525 with inverting inputs, an AND gate 530 with inverting and non-inverting inputs, a first multiplexer 540, a second multiplexer 545, and a DECM 550.

The first flip-flop 505 includes a data input (D) configured to receive the fsm_pos signal from an LUT, such as LUT 310 previously discussed. The first flip-flop 505 further includes a clock input (>) configured to receive an input clock $CLK_i$. The first flip-flop 505 additionally includes a non-inverting output (Q) coupled to a data input (D) of the second flip-flop 510. The first flip-flop 505 further includes an inverting output ($\overline{Q}$) coupled to a first input of the AND gate 515. The second flip-flop 510 includes a clock input (>) configured to receive the input clock $CLK_i$, a non-inverting output (Q) coupled to a first inverting input of the AND gate 525, and an inverting output ($\overline{Q}$) coupled to a second input of the AND gate 515.

The third flip-flop 520 includes a data input (D) configured to receive a gated_off signal, a clock input (>) configured to receive the input clock $CLK_i$, a non-inverting output (Q) coupled to a second inverting input of the AND gate 525, and an inverting output ($\overline{Q}$) coupled to a non-inverting input of the AND gate 530. The AND gate 515 includes an output coupled to an inverting input of the AND gate 530. In effect, the first and second flip-flops 505 and 510 and the AND gate 515 operate as a sequential/logic circuit to generate the signals $A_{21}$ and $A_{20}$ based on the fsm_pos signal a half-period prior to being used by the DECM 550 in generating the output clock $CLK_o$ in a dual-edge aware mode.

The AND gate 525 is configured to generate the $A_{21}$ signal (similar to signal $A_1$ in the dual-edge aware clock divider 300), which is the logic level (high or low) of the output clock $CLK_o$ generated by the DECM 550 in response to a rising edge of the input clock $CLK_i$ in the dual-edge aware mode and the gated_off signal being deasserted. The AND gate 530 is configured to generate the $A_{20}$ signal (similar to signal $A_0$ in the dual-edge aware clock divider 300), which is the logic level (low or high) of the output clock $CLK_o$ generated by the DECM 550 in response to a falling edge of the input clock $CLK_i$ in the dual-edge aware mode and the gated_off signal being deasserted. If the gated_off signal is asserted, the AND gates 525 and 530 generate low logic levels, which, in response, the DECM 550 outputs a continuous low logic level in the dual-edge aware mode.

The $A_{21}$ and $A_{20}$ signals generated by the AND gates 525 and 530 are coupled to inputs "1" and "0" of the multiplexers 540 and 545, respectively. A pair of signals $A_{11}$ and $A_{10}$ for controlling the DECM 550 in generating the output clock $CLK_o$ in a single-edge aware mode are applied to inputs "0" and "1" of the multiplexers 540 and 545, respectively.

The fourth flip-flop 535 includes a data input (D) configured to receive a mode signal indicative of whether the current mode is the dual-edge aware mode or the single-edge aware mode. The fourth flip-flop 535 includes a clock input (>) configured to receive the input clock $CLK_i$, a non-inverting output (Q) configured to generate a mux select (SEL1) signal, and an inverting output ($\overline{Q}$) configured to generate another mux select (SEL0) signal. The mux select signals SEL1 and SEL0 are applied to select inputs of the multiplexers 540 and 545, respectively.

If, for example, the mode signal is at a high logic level, the fourth flip-flop 535 generates the mux select signals SEL1 and SEL2 at high and low logic levels in response to the input clock $CLK_i$, respectively. In response, the multiplexers 540 and 545 output the signals $A_{21}$ and $A_{20}$ as control signals $A_1$ and $A_0$ for controlling the DECM 550 in generating the output clock $CLK_o$ in the dual-edge aware mode, respectively. If, on the other hand, the mode signal is at a low logic level, the fourth flip-flop 535 generates the mux select signals SEL1 and SEL2 at low and high logic levels in response to the input clock $CLK_i$, respectively. In response, the multiplexers 540 and 545 output the signals $A_{11}$ and $A_{10}$ as control signals $A_1$ and $A_0$ for controlling the DECM 550 in generating the output clock $CLK_o$ in the single-edge aware mode, respectively.

In response to the control signals $A_1$ and $A_0$, and rising and falling edges of the input clock CLKi, the DECM 550 generates the output clock $CLK_o$. As discussed with reference to hybrid single-edge and dual-edge aware clock divider 400, the hybrid single-edge and dual-edge aware clock divider 500 may generate the output clock $CLK_o$ in the dual-edge aware mode when the M/N value is at or above a threshold (e.g., 2/3). In this regard, the mode signal is at a high logic level, the mux select signals SEL1 and SEL0 are at high and low logic levels, the multiplexers 540 and 545 select $A_{21}$ and $A_{20}$ as control signals $A_1$ and $A_0$ for the DECM 550, and the DECM 550 generates the output clock $CLK_o$ based on the control signals $A_1$ and $A_0$. In this mode, the gated_off signal is deasserted.

The hybrid single-edge and dual-edge aware clock divider 500 may generate the output clock $CLK_o$ in the single-edge aware mode when the M/N value is at or below the threshold (e.g., 2/3). In this regard, the mode signal is at a low logic level, the mux select signals SEL1 and SEL0 are at low and high logic levels, the multiplexers 540 and 545 select $A_{11}$ and $A_{10}$ as control signals $A_1$ and $A_0$ for the DECM 550, and the DECM 550 generates the output clock CLKo based on the control signals $A_1$ and $A_0$. In this mode, the gated_off signal is also deasserted.

Figure 6A:
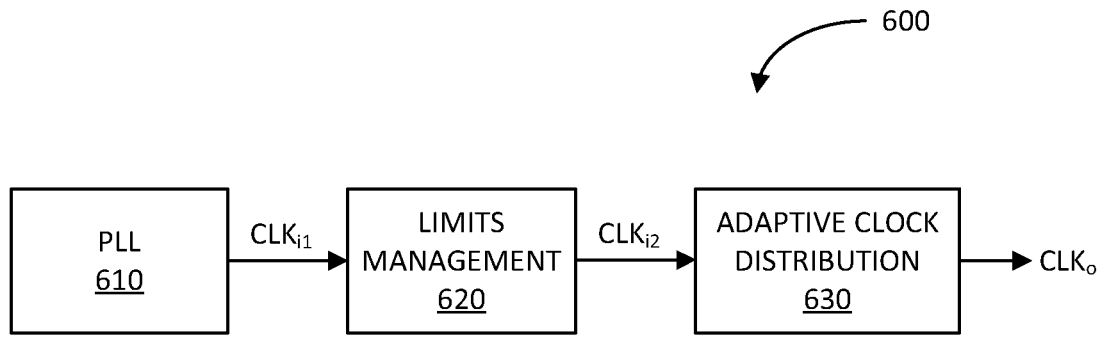
FIG. 6A illustrates a block diagram of an exemplary clock distribution system responsive to current limits and voltage droop management in accordance with another aspect of the disclosure.

FIG. 6A illustrates a block diagram of an exemplary clock distribution system 600 responsive to current limits and voltage droop management in accordance with another aspect of the disclosure. The clock distribution system 600 includes a PLL 610 configured to generate a first input clock $CLK_{i1}$, a current limits management circuit 620 configured to apply a first frequency scaling factor $M_1/N_1$ to the first input clock $CLK_{i1}$ to generate a second input clock $CLK_{i2}$, and an adaptive clock distribution (ACD) circuit 630 configured to apply a second frequency scaling factor $M_2/N_2$ to the second input clock $CLK_{i2}$ to generate an output clock $CLK_o$ for a set of one or more cores. The limits management circuit 620 and ACD circuit 630 may employ any of the clock dividers described herein.

The limits management circuit 620 monitors a current supplied to the set of one or more cores, and when the current exceeds one or more thresholds, the limits management circuit 620 may apply a selected one of a set of first frequency scaling factors $M_1/N_1$ to the first input clock $CLK_{i1}$ to generate the second input clock $CLK_{i2}$, respectively. The selected first scaling factor $M_1/N_1$ is configured to reduce the frequency of the output clock $CLK_o$ applied to the set of one or more cores, which reduces the current supplied to the set of one or more cores such that the current is no exceeds the one or more thresholds. This maintains the current supplied to the set of one or more cores to safe levels.

The ACD circuit 630 is configured to monitor supply voltage droop applied to the set of one or more cores or the change in the current over time (di/dt) supplied to the set of one or more cores, and apply a selected one of a set of second frequency scaling factors $M_2/N_2$ to the second input clock $CLK_{i2}$ to generate the output clock $CLK_o$, respectively. The selected second scaling factor $M_2/N_2$ is configured to reduce the frequency of the output clock $CLK_o$ applied to the set of one or more cores, which reduces or counters the voltage droop or the change in the current over time (di/dt) supplied to the set of one or more cores such that the voltage droop or the di/dt is below a thresholds. The ACD circuit 630 reacts faster to large voltage droops or di/dt than the limits management circuit 620 reacts to the current exceeding one or more thresholds. Accordingly, the ACD circuit 630 prevents damage to or faulty operation of the set of one or more cores when a large voltage droop or di/dt occurs.

A drawback of the clock distribution system 600 results from the cascaded configuration of the limits management circuit 620 and the ACD circuit 630. If, for example, the first input clock $CLK_{i1}$ has a frequency of 2 GHz, and the limits management circuit 620 applies a 2/3 frequency scaling factor to the first input clock $CLK_{i1}$ prior to a voltage droop event, the frequency of the output clock $CLK_o$ would be 1.33 GHz. Then, in response to a voltage droop event, the ACD circuit 630 applies 1/2 frequency scaling factor to the second input clock $CLK_{i2}$, then the frequency of the output clock $CLK_o$ would be 667 MHz. The ACD circuit 630 may have intended for the frequency of the output clock $CLK_o$ to be 1 GHz in response to the voltage droop, but because the ACD circuit 630 is cascaded with the current limits management circuit 620, the frequency of the output clock $CLK_o$ is lower than the target frequency.

Figure 6B:
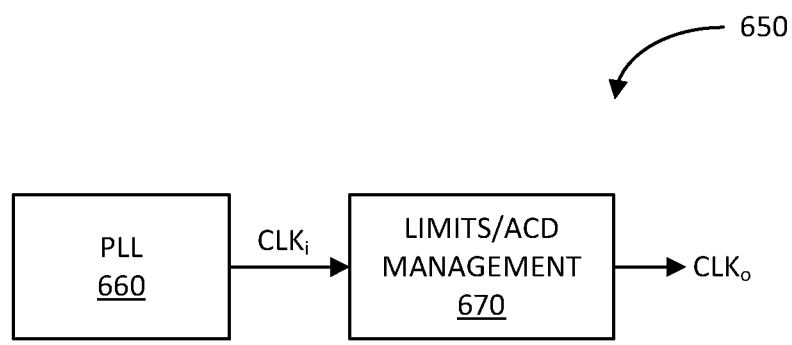
FIG. 6B illustrates a block diagram of another exemplary clock distribution system responsive to current limits and voltage droop management in accordance with another aspect of the disclosure.

FIG. 6B illustrates a block diagram of another exemplary clock distribution system 650 responsive to current limits and voltage droop management in accordance with another aspect of the disclosure. The clock distribution system 650 differs from the clock distribution system 600 in that the current limits management and ACD are performed in parallel using the same clock divider.

In particular, the clock distribution system 650 includes a PLL 660 configured to generate an input clock $CLK_i$ and a limits/ACD management circuit 670 configured to apply a frequency scaling factor M/N to the input clock $CLK_i$ to generate an output clock $CLK_o$ for a set of one or more cores.

Thus, the limits/ACD management circuit 670 monitors a current supplied to the set of one or more cores, and when the current exceeds one or more thresholds, the limits/ACD management circuit 670 may apply a selected one of a set of frequency scaling factors M/N to the input clock $CLK_i$ to generate the output clock $CLK_o$. The selected scaling factor M/N is configured to reduce the frequency of the output clock $CLK_o$ applied to the set of one or more cores such that current supplied to the core(s) drop below the one or more thresholds. In parallel, the limits/ACD management circuit 670 monitors for voltage droop or di/dt that exceed a threshold, and selects another frequency scaling factor M/N to deal with the excessive voltage droop or di/dt.

Thus, considering again the example above where the PLL 660 generates the input clock $CLK_i$ with a frequency of 2 GHz, and the limits management of the limits/ACD management circuit 670 has generated an output clock $CLK_o$ with a frequency of 1.33 GHz by applying a 2/3 frequency scaling factor to the input clock $CLK_i$; then when a voltage droop or di/dt is detected that exceeds a threshold, the ACD management of the limits/ACD management circuit 670 may apply a frequency scaling factor of ½ to the input clock $CLK_i$ to generate the output clock with a frequency of 1 GHz. Thus, because the ACD management is less dependent on the limits management, the limits/ACD management circuit 670 is able to more accurately control the frequency of the output clock $CLK_o$ in response to current limits and voltage droops.

Figure 7A:
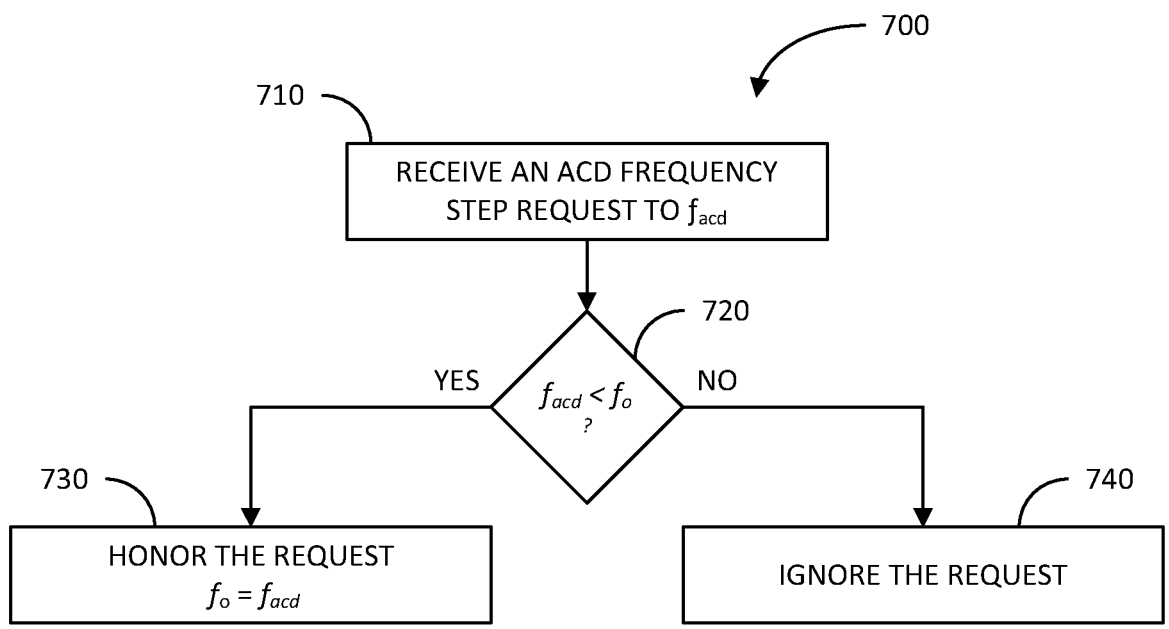
FIG. 7A illustrates a flow diagram of an exemplary method of operating the clock distribution system of FIG. 6B in accordance with another aspect of the disclosure.

FIG. 7A illustrates a flow diagram of an exemplary method 700 of operating the clock distribution system 650 in accordance with another aspect of the disclosure. In summary, the method 700 entails limits/ACD management circuit 670 reducing the frequency of the output clock to a target frequency in response to an excessive voltage droop or di/dt based on whether the target frequency is less than the current frequency of the output clock at the time of the excessive voltage droop or di/dt.

In particular, the method 700 includes receiving an ACD frequency step request to set the frequency of the output clock $CLK_o$ to a target frequency $f_{acd}$ (block 710). The ACD management of the limits/ACD management circuit 670 may have issued the request in response to detecting a voltage droop or di/dt that exceeds a threshold. The method 700 further includes determining whether the target frequency $f_{acd}$ is below the current frequency $f_o$ of the output clock $CLK_o$ (i.e., the frequency $f_o$ at the time of the issuance of the request) (block 720).

If, in block 730, it is determined that the target frequency $f_{acd}$ is below the current frequency $f_o$, then the ACD frequency step request is honored, and the limits/ACD management circuit 670 sets the output frequency $f_o$ of the output clock $CLK_o$ to the target frequency $f_{acd}$ (block 730). If, on the other hand, in block 730 it is determined that the target frequency $f_{acd}$ is not below the current frequency $f_o$, then limits/ACD management circuit 670 does not honor or ignores the request (block 740).

Figure 7B:
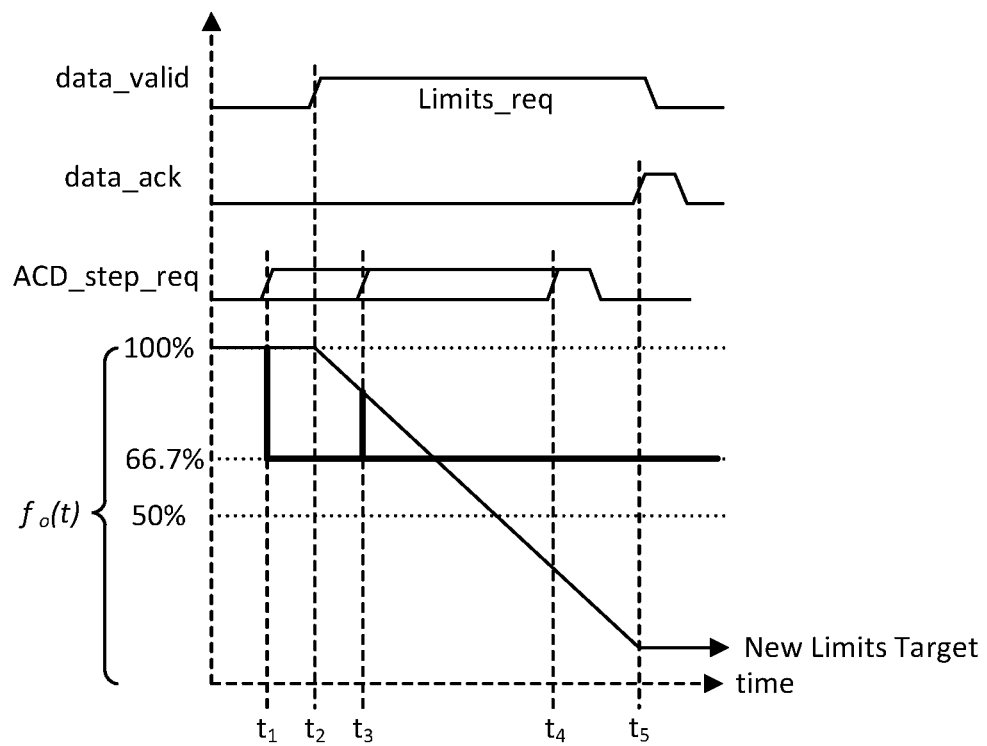
FIG. 7B illustrates a timing diagram related to the exemplary method of operating the clock distribution system of FIG. 6B in accordance with another aspect of the disclosure.

FIG. 7B illustrates a timing diagram related to the exemplary method 700 of operating the clock distribution system 650 in accordance with another aspect of the disclosure. The vertical axis represents various signals involved in the operation of the limits/ACD management circuit 670. For example, from top-to-bottom, these signals include: a data-_valid signal indicative of when a current limits frequency step request is initiated, performed, and completed; a data_ack signal indicative of when the limits frequency step request is complete; an ACD_step_req indicative of when an ACD frequency step request occurs; and the frequency over time $f_o(t)$ of the output clock $CLK_o$. The horizontal axis represents time.

At time $t_1$, the frequency $f_o$ of the output clock $CLK_o$ is at 100% (e.g., M/N=1). At such time, the ACD management of the limits/ACD management circuit 670 issues an ACD frequency step request to step down the frequency of the output clock CLKo to a target frequency $f_{acd}$ to 66.7% (e.g., M/N=2/3). As the target frequency $f_{acd}$ is less than the current frequency $f_o$ of the output clock $CLK_o$, according to the method 700, the ACD step request is honored, and the frequency $f_o$ of the output clock $CLK_o$ is changed to 66.7%, as indicated by the corresponding vertical thick line.

At time $t_2$, the limits management of the limits/ACD management circuit 670 issues a limits frequency change request to 20% (e.g., M/N=2/10). In response to the request, the limits/ACD management circuit 670 begins to reduce the frequency $f_o$ of the output clock $CLK_o$ (e.g., successively changing M/N from 10/10 to 2/10). At time $t_3$, the ACD management of the limits/ACD management circuit 670 issues an ACD frequency step request to step down the frequency of the output clock $CLK_o$ to a target frequency $f_{acd}$ to 66.7% (e.g., M/N=2/3). As the target frequency $f_{acd}$ is less than the current frequency $f_o$ of the output clock $CLK_o$ at time $t_3$, according to the method 700, the ACD step request is honored, and the frequency $f_o$ of the output clock $CLK_o$ is changed to 66.7%, as indicated by the corresponding vertical thick line.

At time $t_4$, the ACD management of the limits/ACD management circuit 670 issues an ACD frequency step request to step down the frequency of the output clock $CLK_o$ to a target frequency $f_{acd}$ to 66.7% (e.g., M/N=2/3). As the target frequency $f_{acd}$ is not less than the current frequency $f_o$ of the output clock $CLK_o$ at time $t_4$, according to the method 700, the ACD step request is not honored or ignored. As illustrated, at time $t_5$, the limits/ACD management circuit 670 has completed the transitioning of the frequency $f_o$ of the output clock $CLK_o$ to the limits target frequency of 20%.

Figures 7C, 8A:
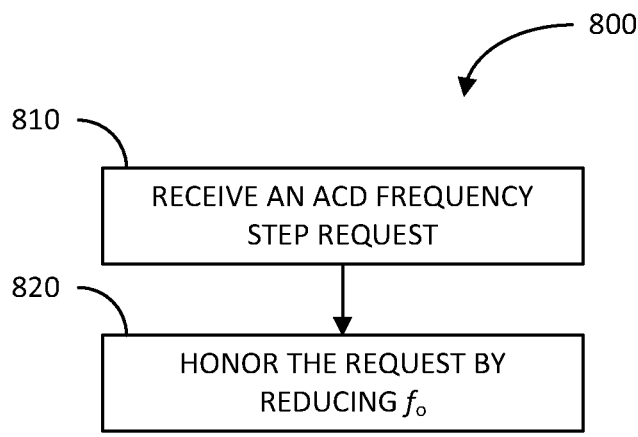
FIG. 7C illustrates a table related to the exemplary method of operating the clock distribution system of FIG. 6B in accordance with another aspect of the disclosure.
FIG. 8A illustrates a flow diagram of another exemplary method of operating the clock distribution system of FIG. 6B in accordance with another aspect of the disclosure.

FIG. 7C illustrates a table related to the exemplary method 700 of operating the clock distribution system 650 in accordance with another aspect of the disclosure. The table depicts example of how the limits/ACD management circuit 670 may handle various types of ACD frequency step requests. The left column of the table indicates the current frequency $f_o$ of the output clock $CLK_o$; and the remaining columns from left-to-right indicate target frequencies in response to different types of ACD frequency step requests ACD-00 to ACD-11, ranging from least aggressive to most aggressive.

Thus, according to the table, if the current frequency $f_o$ of the output clock $CLK_o$ is above 66.7%, such as at 100%, 91.7%, 83.3%, and 75%, and the ACD management issues an ACD frequency step request type ACD-00 or ACD-01, the limits/ACD management circuit 670 honors the request, and sets the frequency of the output clock $CLK_o$ to 66%. If the ACD request type is an ACD-10 request, the limits/ACD management circuit 670 honors the request, and sets the frequency of the output clock $CLK_o$ to 50%. If the ACD request type is an ACD-11 request, the limits/ACD management circuit 670 honors the request, and sets the frequency of the output clock $CLK_o$ to 33%.

If the current frequency $f_o$ of the output clock $CLK_o$ is at or below 66.7%, and the ACD management issues an ACD frequency step request type ACD-00 or ACD-01, the limits/ACD management circuit 670 does not honor or ignores the request (i.e., not applicable (N/A)). If the current frequency $f_o$ of the output clock $CLK_o$ is within the range of 54.2 and 66.7%, and the ACD request issued is an ACD-10 request, the limits/ACD management circuit 670 honors the request, and sets the frequency of the output clock $CLK_o$ to 50%. If the current frequency $f_o$ of the output clock $CLK_o$ is at or below 50%, and the ACD management issues an ACD frequency step request ACD-10, the limits/ACD management circuit 670 does not honor or ignores the request (i.e., N/A).

If the current frequency $f_o$ of the output clock $CLK_o$ is within the range of 37.5 and 66.7%, and the ACD request issued is an ACD-11 request, the limits/ACD management circuit 670 honors the request, and sets the frequency of the output clock $CLK_o$ to 33%. If the current frequency $f_o$ of the output clock $CLK_o$ is at or below 33.3%, and the ACD management issues an ACD frequency step request ACD-11, the limits/ACD management circuit 670 does not honor or ignores the request (i.e., not applicable N/A).

FIG. 8A illustrates a flow diagram of another exemplary method 800 of operating the clock distribution system 650 in accordance with another aspect of the disclosure. In summary, the method 800 differs from the method 700 in that all ACD frequency step requests are honored.

More specifically, the method 800 includes receiving an ACD frequency step request to reduce the frequency of the output clock $CLK_o$ (block 810). The ACD management of the limits/ACD management circuit 670 may have issued the request in response to a voltage droop or di/dt that exceeds a threshold. The method 800 further includes the limits/ACD management circuit 670 honoring the request and reducing the output frequency $f_o$ of the output clock $CLK_o$ based on the request (block 820).

Figures 8B, 8C:
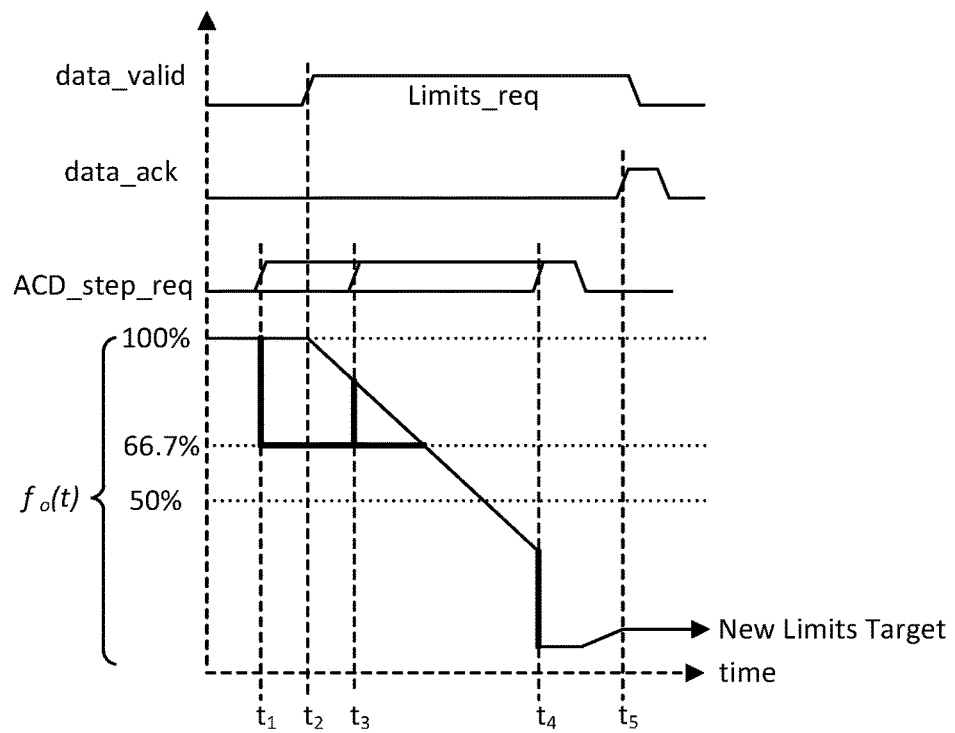
FIG. 8B illustrates a timing diagram related to the another exemplary method of operating the clock distribution system of FIG. 6B in accordance with another aspect of the disclosure.
FIG. 8C illustrates a table related to the another exemplary method of operating the clock distribution system of FIG. 6B in accordance with another aspect of the disclosure.

FIG. 8B illustrates a timing diagram related to the exemplary method 800 of operating the clock distribution system 650 in accordance with another aspect of the disclosure. The vertical axis represents various signals involved in the operation of the limits/ACD management circuit 670. For example, from top-to-bottom, these signals include: a data_valid signal indicative of when a limits frequency step request is initiated, performed, and completed; a data_ack signal indicative of when the limits frequency change request is complete; an ACD_step_req indicative of when an ACD frequency step request occurs; and the frequency over time $f_o(t)$ of the output clock $CLK_o$. The horizontal axis represents time.

At time $t_1$, the frequency $f_o$ of the output clock $CLK_o$ is at 100% (e.g., M/N=1). At such time, the ACD management of the limits/ACD management circuit 670 issues an ACD frequency step request to step down the frequency of the output clock $CLK_o$. In response, the limits/ACD management circuit 670 honors the ACD step request, and the reduces the frequency $f_o$ of the output clock $CLK_o$ to, for example, 66.7%, as indicated by the corresponding vertical thick line.

At time $t_2$, the limits management of the limits/ACD management circuit 670 issues a limits frequency change request to 10% (e.g., M/N=1/10). In response to the request, the limits/ACD management circuit 670 begins to reduce the frequency $f_o$ of the output clock $CLK_o$ (e.g., successively changing M/N from 10/10 to 2/10). At time $t_3$, the ACD management of the limits/ACD management circuit 670 issues an ACD frequency step request to step down the frequency of the output clock $CLK_o$. In response, the limits/ACD management circuit 670 honors the ACD step request, and the reduces the frequency $f_o$ of the output clock $CLK_o$ to, for example, 66.7%, as indicated by the corresponding vertical thick line.

At time $t_4$, the ACD management of the limits/ACD management circuit 670 issues an ACD frequency step request to step down the frequency of the output clock $CLK_o$. In response, the limits/ACD management circuit 670 honors the ACD step request, and reduces the frequency $f_o$ of the output clock $CLK_o$ to, for example, 17%, as indicated by the corresponding vertical thick line. As illustrated, at time $t_5$, the limits/ACD management circuit 670 has completed the transitioning of the frequency $f_o$ of the output clock $CLK_o$ to the limits target frequency of 20%.

FIG. 8C illustrates a table related to the exemplary method 800 of operating the clock distribution system 650 in accordance with another aspect of the disclosure. The table depicts examples of how the limits/ACD management circuit 670 may handle various types of ACD frequency step requests. The left column of the table indicates the current frequency $f_o$ of the output clock $CLK_o$; and the remaining columns from left-to-right indicate target frequencies in response to different types of ACD frequency step requests ACD-00 to ACD-11, ranging from least aggressive to most aggressive.

Considering a few examples, according to the table, if the current frequency $f_o$ of the output clock $CLK_o$ is above 66.7%, such as at 100%, 91.7%, 83.3%, and 75%, and the ACD management issues an ACD frequency step request ACD-00, the limits/ACD management circuit 670 honors the request, and sets the frequency of the output clock $CLK_o$ to 66%. If at such current frequency $f_o$, the ACD management issues an ACD frequency step request ACD-01, the limits/ACD management circuit 670 honors the request, and sets the frequency of the output clock $CLK_o$ to 66% if the current frequency $f_o$ is at 100% or 91.7%, and to 50% if the current frequency $f_o$ is at 83.3% or 75%.

If at such current frequency $f_o$ (100%, 91.7%, 83.3%, and 75%), the ACD management issues an ACD frequency step request ACD-10, the limits/ACD management circuit 670 honors the request, and sets the frequency of the output clock $CLK_o$ to 50% if the current frequency $f_o$ is at 100%, to 40% if the current frequency $f_o$ is 91.7% or 83.3%, and to 33% if the current frequency $f_o$ is at 75%. If at such current frequency $f_o$, the ACD management issues an ACD frequency step request ACD-11, the limits/ACD management circuit 670 honors the request, and sets the frequency of the output clock $CLK_o$ to 40% if the current frequency $f_o$ is at 100% or 97.7%, and to 33% if the current frequency $f_o$ is 83.3% or 75%. Considering these examples, the remaining entries in the table are self-explanatory.

Figure 9:
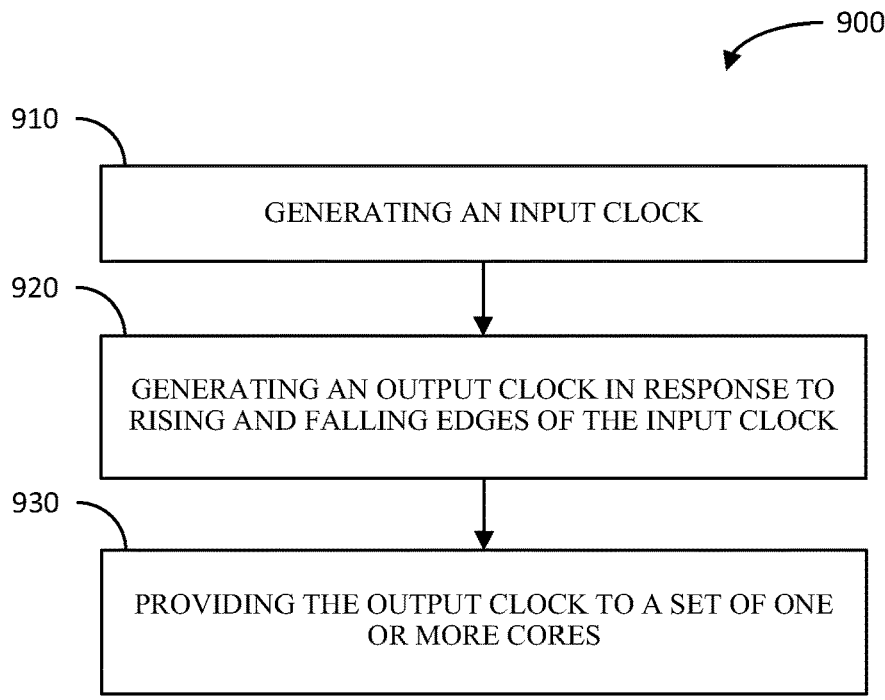
FIG. 9 illustrates a flow diagram of an exemplary method of generating an output clock in accordance with another aspect of the disclosure.

FIG. 9 illustrates a flow diagram of an exemplary method 900 of generating an output clock in accordance with another aspect of the disclosure. The method 900 includes generating an input clock (block 910). Examples of means for generating an input clock include any of the PLLs described herein. The method 900 further includes generating an output clock in response to rising and falling edges of the input clock (block 920). Examples of means for generating an output clock in response to rising and falling edges of the input clock include any of the dual-edge aware clock dividers described herein. The method 900 further includes providing the output clock to a set of one or more cores (block 930). Examples of means of providing the output clock to a set of one or more cores include any of the coupling of the dual-edge aware clock dividers to a set of one or more cores.

Figure 10:
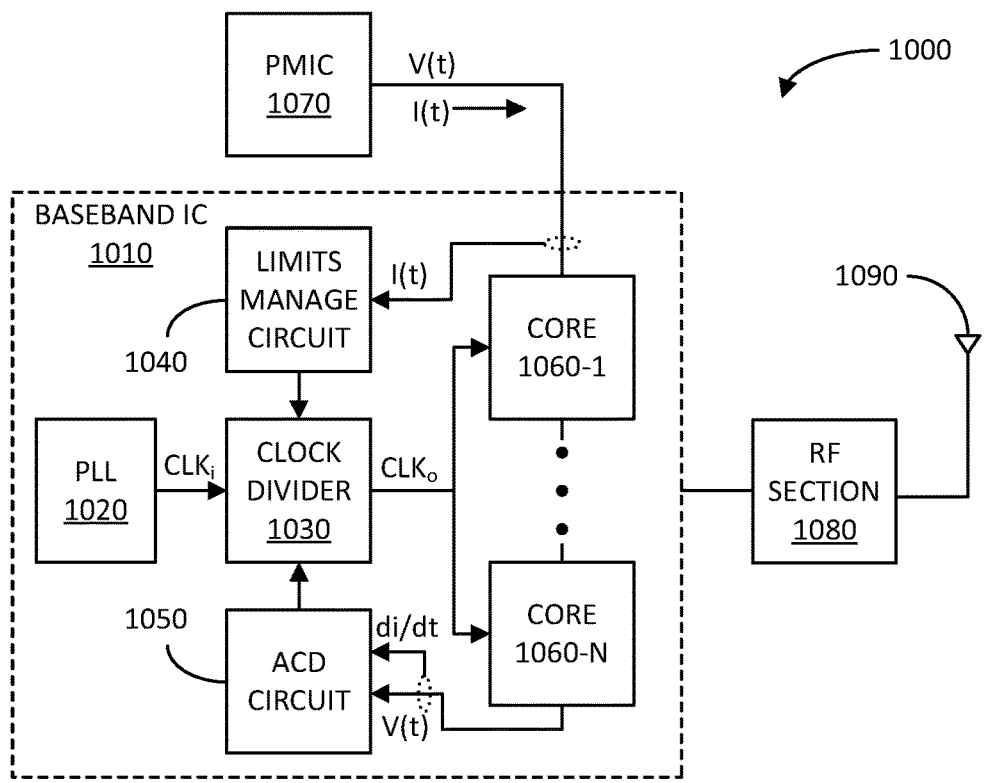
FIG. 10 illustrates a block diagram of an exemplary wireless communication device in accordance with another aspect of the disclosure.

FIG. 10 illustrates a block diagram of an exemplary wireless communication device 1000 in accordance with another aspect of the disclosure. The wireless communication device 1000 may be configured as a smart phone, desktop computer, laptop computer, computing pad or tablet, or other types of wireless computing device. The wireless communication device 1000 includes a baseband integrated circuit (IC) 1010, a power management integrated circuit (PMIC) 1070, a radio frequency (RF) section 1080, and at least one antenna 1090.

The baseband IC 1010 includes a phase locked loop (PLL) configured to generate an input clock $CLK_i$; a clock divider 1030 configured to generate an output clock $CLK_o$ by applying a frequency scaling factor M/N to the input clock $CLK_i$; and a set of one or more cores 1060-1 to 1060-N configured to perform a set of one or more digital operations driven by the output clock $CLK_o$. The clock divider 1030 may be configured as any of the dual-edge aware clock dividers or hybrid dual-edge and single-edge aware clock dividers previously discussed. The PMIC 1070 supplies power in the form of a supply voltage V(t) and current I(t) to the set of one or more cores 1060-1 to 1060-N.

The baseband IC 1010 further includes a current limits management circuit 1040 and an adaptive clock distribution (ACD) management circuit 1050. The current limits management circuit 1040 monitors the current I(t) supplied to the set of one or more cores 1060-1 to 1060-N, and provides a limits change request to the clock divider 1030 in response to the current I(t) exceeding a threshold. In response, the clock divider 1030 reduces the frequency of the output clock $CLK_o$ based on the limits change request.

Similarly, the ACD circuit 1050 monitors the voltage V(t) and/or the current I(t) supplied to the set of one or more cores 1060-1 to 1060-N, and provides an ACD step request to the clock divider 1030 in response to the voltage V(t) droop or a change in the current I(t) over time (di/dt) exceeding a threshold. In response, the clock divider 1030 reduces the frequency of the output clock $CLK_o$ based on the ACD step request. As discussed with reference to FIGS. 7A-7C and 8A-8C, the ACD step request may be honored if the current frequency of the output clock $CLK_o$ is above a target frequency at the time of the ACD step request (otherwise, not honored or ignored). Alternatively, the ACD step request is honored independent of the current frequency of the output clock CLKo at the time of the ACD step request.

The baseband IC 1010 may provide a transmit baseband signal to the RF section 1080. In response, the RF section 1080 may convert the transmit baseband signal from digital-to-analog, up-convert the transmit analog signal to an RF signal, power amplify the RF signal, and provide the amplified RF signal to the antenna 1090 for wireless transmission to one or more other wireless devices. The RF section 1080 may also receive an RF signal from one or more other wireless devices via the antenna 1090, low noise amplify the RF signal, downconvert the RF signal into an analog baseband signal, convert the analog baseband signal from analog-to-digital, and provide the digital baseband signal to the baseband IC 1010 for further processing.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
   a phase locked loop (PLL) configured to generate an input clock;
   a dual-edge aware clock divider configured to generate an output clock based on the input clock and a ratio of an integer M over an integer N, wherein the output clock includes one or more rising edges that are substantially time aligned with one or more rising edges and one or more falling edges of the input clock, respectively; and
   a set of one or more cores configured to perform one or more operations in response to the output clock.

2. The apparatus of claim 1, wherein a frequency of the output clock is based on a frequency of the input clock multiplied by the ratio.

3. The apparatus of claim 2, wherein the integer M includes a range up to N.

4. The apparatus of claim 1, wherein the output clock includes M pulses within a sequence time window with a length of N periods of the input clock.

5. The apparatus of claim 1, wherein the dual-edge aware clock divider is configured to generate the output clock based on inverted and non-inverted portions of the input clock.

6. An apparatus, comprising:
   a phase locked loop (PLL) configured to generate an input clock;
   a dual-edge aware clock divider configured to generate an output clock based on the input clock and a ratio of an integer M over an integer N, wherein the dual-edge aware clock divider comprises:
      a dual-edge clock multiplexer (DECM) including a select input configured to receive the input clock, and an output configured to generate the output clock; and
      a logic circuit configured to provide control signals to inputs of the DECM, wherein the control signals determines whether the DECM generates the output clock based on an inversion of the input clock or non-inversion of the input clock; and
   a set of one or more cores configured to perform one or more operations in response to the output clock.

7. An apparatus, comprising:
   a phase locked loop (PLL) configured to generate an input clock;
   a dual-edge aware clock divider configured to generate an output clock based on the input clock and a ratio of an integer M over an integer N;
   a single-edge aware clock divider configured to generate the output clock based on the input clock and the ratio of integer M over integer N in response to the ratio being at or below a threshold, wherein the dual-edge aware clock divider is configured to generate the output clock in response to the ratio being at or above the threshold; and
   a set of one or more cores configured to perform one or more operations in response to the output clock.

8. An apparatus, comprising:
   a phase locked loop (PLL) configured to generate an input clock;
   a dual-edge aware clock divider configured to generate an output clock based on the input clock and a ratio of an integer M over an integer N;
   a set of one or more cores configured to perform one or more operations in response to the output clock;
   a current limits management circuit configured to reduce a frequency of the output clock in response to a current supplied to the set of one or more cores exceeding a first threshold; and
   an adaptive clock distribution (ACD) circuit configured to reduce the frequency of the output clock in response to a voltage droop or a change in the current over time (di/dt) exceeding a second threshold.

9. The apparatus of claim 8, wherein a request by the ACD circuit to reduce the frequency of the output clock to a target frequency is honored if the frequency of the output clock at a time of the request is above the target frequency.

10. The apparatus of claim 8, wherein a request by the ACD circuit to reduce the frequency of the output clock to a target frequency is honored regardless of the frequency of the output clock at a time of the request.

* * * * *